United States Patent
Neuman et al.

(10) Patent No.: US 10,827,629 B2
(45) Date of Patent: Nov. 3, 2020

(54) CONTROL BOXES AND SYSTEM-ON-MODULE CIRCUIT BOARDS FOR UNMANNED VEHICLES

(71) Applicant: GE Aviation Systems LLC, Grand Rapids, MI (US)

(72) Inventors: Randall Lee Neuman, Hudsonville, MI (US); Stefano Angelo Mario Lassini, Lowell, MI (US); Jason Eggiman, Alto, MI (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 15/875,325

(22) Filed: Jan. 19, 2018

(65) Prior Publication Data

US 2019/0230800 A1 Jul. 25, 2019

(51) Int. Cl.
*H05K 5/00* (2006.01)
*H05K 1/14* (2006.01)
(Continued)

(52) U.S. Cl.
CPC ......... *H05K 5/0017* (2013.01); *H05K 1/0271* (2013.01); *H05K 1/115* (2013.01);
(Continued)

(58) Field of Classification Search
CPC ........ H05K 1/115; H05K 1/02; H05K 1/0222; H05K 3/284; H05K 7/20; G06F 1/20; G06F 1/84; G06F 1/184
(Continued)

(56) References Cited

U.S. PATENT DOCUMENTS 5,440,755 A * 8/1995 Harwer ................. G06F 13/409
710/105
5,838,542 A * 11/1998 Nelson .................... G06F 1/184
361/704
(Continued)

FOREIGN PATENT DOCUMENTS

WO  WO2014/171098 A1  10/2014
WO  WO2017/135071 A1  8/2017

OTHER PUBLICATIONS

Vanderleest, MPSoC Hypervisor: The Safe & Secure Future of Avionics, DornerWorks, Embedded Systems Engineering, DASC 2015, Prague, 25 pages.
(Continued)

*Primary Examiner* — Tuan T Dinh
(74) *Attorney, Agent, or Firm* — Dority & Manning, P.A.

(57) ABSTRACT

A SOM circuit board includes a main body having a first face surface, an opposing second face surface, a first side surface, an opposing second side surface, a first end surface, and an opposing second end surface. The first and second side surfaces have maximum lengths along a longitudinal direction which are greater than maximum lengths of the first and second end surfaces along a lateral direction. The SOM circuit board further includes a plurality of computing components, each of the plurality of computing components mounted on one of the first face surface or the second face surface. The SOM circuit board further includes an input/output connector mounted on the second face surface. The SOM circuit board further includes a plurality of mounting holes extending along the transverse direction through and between the first face surface and the second face surface.

14 Claims, 13 Drawing Sheets

(51) Int. Cl.
*H05K 7/14* (2006.01)
*H05K 1/02* (2006.01)
*H05K 1/11* (2006.01)
*H05K 5/02* (2006.01)
*H05K 7/20* (2006.01)

(52) U.S. Cl.
CPC .......... *H05K 1/144* (2013.01); *H05K 5/0082* (2013.01); *H05K 5/0247* (2013.01); *H05K 7/1417* (2013.01); *H05K 7/1422* (2013.01); *H05K 7/2039* (2013.01); *H05K 7/20845* (2013.01); *B64C 2201/146* (2013.01); *H05K 1/0204* (2013.01); *H05K 1/0209* (2013.01); *H05K 2201/042* (2013.01); *H05K 2201/09145* (2013.01); *H05K 2201/10409* (2013.01); *H05K 2201/2018* (2013.01); *H05K 2201/2045* (2013.01)

(58) Field of Classification Search
USPC ........ 361/736–737, 752–759, 767–772, 803, 361/807–810; 174/258–262
See application file for complete search history.

(56) References Cited

U.S. PATENT DOCUMENTS

| | | | | |
|---|---|---|---|---|
| 6,147,863 | A * | 11/2000 | Moore | G06F 1/184 361/679.6 |
| 6,219,239 | B1 * | 4/2001 | Mellberg | H05K 7/1431 165/80.3 |
| 6,496,376 | B1 * | 12/2002 | Plunkett | G06F 13/409 361/729 |
| 6,772,261 | B1 * | 8/2004 | D'Antonio | G11C 29/48 365/63 |
| 7,440,293 | B2 * | 10/2008 | Hood, III | G06F 1/184 361/807 |
| 8,004,855 | B2 | 8/2011 | Salama et al. | |
| 8,116,101 | B2 * | 2/2012 | Chang | G06F 1/1656 174/371 |
| 8,665,601 | B1 | 3/2014 | Mangay-Ayam, Jr. et al. | |
| 2006/0023428 | A1 * | 2/2006 | McClure | G06F 1/184 361/724 |
| 2006/0181841 | A1 * | 8/2006 | Chen | H04M 1/0266 361/679.3 |
| 2007/0206365 | A1 * | 9/2007 | Shiu | H05K 3/284 361/752 |
| 2008/0043448 | A1 * | 2/2008 | Finnerty | G06F 1/20 361/748 |
| 2008/0123552 | A1 | 5/2008 | Slaton | |
| 2008/0245555 | A1 * | 10/2008 | Li | H05K 1/0222 174/262 |
| 2011/0181495 | A1 * | 7/2011 | Chu | G09F 9/33 345/1.3 |
| 2012/0024584 | A1 * | 2/2012 | Lee | H05K 3/4092 174/261 |
| 2012/0113603 | A1 * | 5/2012 | Tokunaga | H05K 7/142 361/752 |
| 2013/0176684 | A1 * | 7/2013 | Moore, Jr. | H05K 9/0026 361/720 |
| 2015/0041104 | A1 | 2/2015 | De Bock et al. | |
| 2015/0068703 | A1 | 3/2015 | de Bock et al. | |
| 2015/0264810 | A1 * | 9/2015 | Baba | H05K 1/115 361/760 |
| 2016/0095199 | A1 | 3/2016 | Chauhan et al. | |
| 2016/0321148 | A1 | 11/2016 | Lassini et al. | |
| 2016/0342146 | A1 | 11/2016 | Rencs | |
| 2017/0285627 | A1 | 10/2017 | Feldmann et al. | |
| 2019/0075673 | A1 | 3/2019 | Kogure | |

OTHER PUBLICATIONS

1-Core Technologies, FPGA Architectures Overview, Downloaded Jan. 3, 2018, https://www.pdx.edu/nanogroup/sites/www.pdx.edu.nanogroup/files/FPGA-architecture.pdf. 2 pages.
Vectornav Technologies, Embedded Navigation Solutions, Industrial Series, 2017, 6 pages.
Microsemi, Power Matters, Microcontroller Based FPGA's Hit the Mark, WP0205 White Paper, Jan. 2016, 6 pages.
Microsemi, Power Matters, FPGA and SoC Product Catalog, Lowest Power, Proven Security, and Exceptional Reliability, 2016, 28 pages.
Microsemi, Power Matters, AC400 Application Note, SmartFusion2 SoC FPGA Flash*Freeze Entry and Exit-Libero SoC v11.8, 2017, 23 pages.
Xilinx, Xynq UltraScale+ MPSoC Product Tables and Product Selection Guide, 2016-2017, 16 pages.
Co-Pending U.S. Appl. No. 15/875,275, filed Jan. 19, 2018.
Co-Pending U.S. Appl. No. 15/875,305, filed Jan. 19, 2018.
Co-Pending U.S. Appl. No. 15/875,350, filed Jan. 19, 2018.
Co-Pending U.S. Appl. No. 15/875,381, filed Jan. 19, 2018.
Co-Pending U.S. Appl. No. 15/875,429, filed Jan. 19, 2018.
Co-Pending U.S. Appl. No. 15/875,454, filed Jan. 19, 2018.
Co-Pending U.S. Appl. No. 15/875,481, filed Jan. 19, 2018.
European Search Report Corresponding to Application No. 19150304.4 dated Jun. 19, 2019.

* cited by examiner

CONTROL BOXES AND SYSTEM-ON-MODULE CIRCUIT BOARDS FOR UNMANNED VEHICLES

FIELD

The present disclosure relates generally to improved control boxes and system-on-module circuit boards for utilization with unmanned vehicles.

BACKGROUND

An unmanned aerial vehicle (UAV) is an airborne vehicle having no onboard pilot. Typically, UAVs are controlled remotely by a pilot, by onboard control systems, or by a combination of a remote pilot and onboard control system. Most unmanned aerial vehicles include a control system to control vehicle operations. Often, a control system for a UAV includes one or more vehicle control systems including onboard navigation systems such as inertial navigation systems and satellite navigation systems. Unmanned aerial vehicles may use inertial navigation sensors such as accelerometers and gyroscopes for flight positioning and maneuvering and satellite-based navigation for general positioning and wayfinding. Most control systems additionally include one or more mission control systems for performing one or more mission control functions, such as capturing images or delivering a payload. Typically, individual hardware components are provided onboard a UAV for each vehicle control system and each mission control system.

BRIEF DESCRIPTION

Aspects and advantages of the invention will be set forth in part in the following description, or may be obvious from the description, or may be learned through practice of the invention.

In accordance with one embodiment, a system on module ("SOM") circuit board defining a lateral direction, a longitudinal direction, and a transverse direction is provided. The SOM circuit board includes a main body having a first face surface, an opposing second face surface, a first side surface, an opposing second side surface, a first end surface, and an opposing second end surface. The first and second side surfaces have maximum lengths along the longitudinal direction which are greater than maximum lengths of the first and second end surfaces along the lateral direction. The SOM circuit board further includes a plurality of computing components, each of the plurality of computing components mounted on one of the first face surface or the second face surface. The SOM circuit board further includes an input/output connector mounted on the second face surface. The SOM circuit board further includes a plurality of mounting holes extending along the transverse direction through and between the first face surface and the second face surface. The plurality of mounting holes includes a first array of mounting holes spaced apart along the longitudinal direction proximate the first side surface, a second array of mounting holes spaced apart along the longitudinal direction proximate the second side surface, and a third mounting hole disposed between the first array and second array along the lateral direction.

In accordance with another embodiment, a system on module ("SOM") circuit board defining a lateral direction, a longitudinal direction, and a transverse direction is provided. The SOM circuit board includes a main body having a first face surface, an opposing second face surface, a first side surface, an opposing second side surface, a first end surface, and an opposing second end surface. The first and second side surfaces have maximum lengths along the longitudinal direction which are greater than maximum lengths of the first and second end surfaces along the lateral direction. The SOM circuit board further includes a plurality of computing components, each of the plurality of computing components mounted on one of the first face surface or the second face surface. The SOM circuit board further includes one or more input/output connectors mounted on the second face surface proximate the first side surface, wherein input/output connectors of the SOM circuit board are only disposed proximate the first side surface relative to the second side surface. The SOM circuit board further includes a plurality of mounting holes extending along the transverse direction through and between the first face surface and the second face surface.

In accordance with another embodiment, a control box defining a lateral direction, a longitudinal direction, and a transverse direction is provided. The control box includes a housing defining an interior, a circuit board disposed within the interior, and an input/output connector extending from the housing. The control box further includes a heat sink removably connected to the housing such that the circuit board is positioned between the housing and the heat sink. The circuit board is in contact with the heat sink.

In accordance with another embodiment, a control box defining a lateral direction, a longitudinal direction, and a transverse direction is provided. The control box includes a housing defining an interior, the housing including a cover and a stiffener, the stiffener removably connected to the housing. The control box further includes a circuit board disposed within the interior, wherein the circuit board includes a plurality of computing components and a thermal interface material disposed on one or more of the computing components. The control box further includes an input/output connector extending from the housing. The control box further includes a heat sink removably connected to the stiffener such that the circuit board is positioned between the stiffener and the heat sink. The thermal interface material is in contact with the heat sink.

In accordance with another embodiment, a control box defining a lateral direction, a longitudinal direction, and a transverse direction is provided. The control box includes a housing defining an interior, the housing including a cover and a stiffener, the stiffener removably connected in contact with the cover, the stiffener including an outer frame and at least one cross-member. The control box further includes a heat sink removably connected in contact with the stiffener. The control box further includes a first circuit board disposed within the interior, the first circuit board positioned between the stiffener and the heat sink, and a second circuit board disposed within the interior, the second circuit board positioned between the cover and the stiffener. The cover, stiffener, and heat sink are stacked along the transverse direction.

In accordance with another embodiment, a control box defining a lateral direction, a longitudinal direction, and a transverse direction is provided. The control box includes a housing defining an interior, the housing including a cover and a stiffener, the stiffener removably connected in contact with the cover, the stiffener including an outer frame, at least one cross-member, and a plurality of fingers. The control box further includes a heat sink removably connected in contact with the stiffener. The control box further includes a first circuit board disposed within the interior, the first circuit board positioned between and in contact with the stiffener and the heat sink, and a second circuit board disposed within the interior, the second circuit board positioned between the cover and the stiffener. The cover, stiffener, and heat sink are stacked along the transverse direction.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION

A full and enabling disclosure of the present invention, including the best mode thereof, directed to one of ordinary skill in the art, is set forth in the specification, which makes reference to the appended figures, in which.

DETAILED DESCRIPTION

Figure 1:
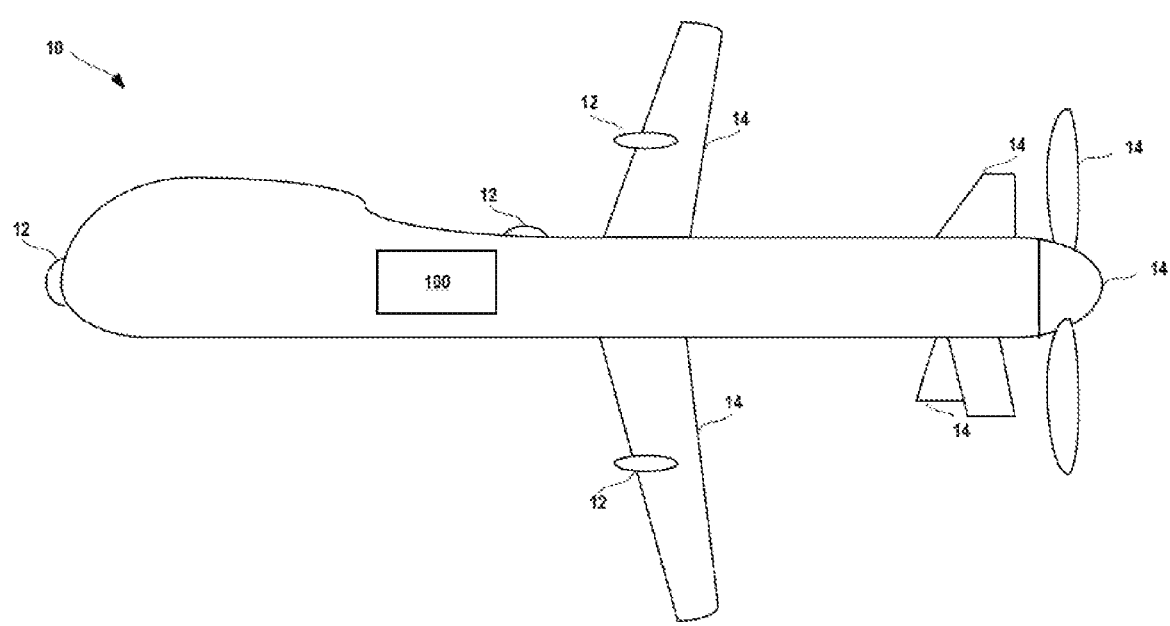
FIG. 1 is a block diagram depicting an example of an unmanned aerial vehicle (UAV) in accordance with embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 is a schematic view of an example unmanned aerial vehicle (UAV) UAV 10. UAV 10 is a vehicle capable of flight without an onboard pilot. For example, and without limitation, UAV 10 may be a fixed wing aircraft, a tilt-rotor aircraft, a helicopter, a multirotor drone aircraft such as a quadcopter, a blimp, a dirigible, or other aircraft.

UAV 10 includes a plurality of vehicle devices including at least one propulsion and movement (PM) device 14. A PM device 14 produces a controlled force and/or maintains or changes a position, orientation, or location of UAV 10. A PM device 14 may be a thrust device or a control surface. A thrust device is a device that provides propulsion or thrust to UAV 10. For example, and without limitation, a thrust device may be a motor driven propeller, jet engine, or other source of propulsion. A control surface is a controllable surface or other device that provides a force due to deflection of an air stream passing over the control surface. For example, and without limitation, a control surface may be an elevator, rudder, aileron, spoiler, flap, slat, air brake, or trim device. Various actuators, servo motors, and other devices may be used to manipulate a control surface. PM device 14 may also be a mechanism configured to change a pitch angle of a propeller or rotor blade or a mechanism configured to change a tilt angle of a rotor blade.

UAV 10 may be controlled by systems described herein including, without limitation, an onboard control system including a control box 100, a ground control station (not shown in FIG. 1), and at least one PM device 14. UAV 10 may be controlled by, for example, and without limitation, real-time commands received by UAV 10 from the ground control station, a set of pre-programmed instructions received by UAV 10 from the ground control station, a set of instructions and/or programming stored in the onboard control system, or a combination of these controls.

Real-time commands can control at least one PM device 14. For example, and without limitation, real-time commands include instructions that, when executed by the onboard control system, cause a throttle adjustment, flap adjustment, aileron adjustment, rudder adjustment, or other control surface or thrust device adjustment.

In some embodiments, real-time commands can further control additional vehicle devices of UAV 10, such as one or more secondary devices 12. A secondary device 12 is an electric or electronic device configured to perform one or more secondary functions to direct propulsion or movement of the UAV. Secondary devices may be related to propulsion or movement of the UAV, but typically provide one or more vehicle or mission functions independent of direct control of vehicle propulsion or motion control. For example, secondary devices may include mission-related devices such as cameras or other sensors used for object detection and tracking. Other examples of secondary devices 12 may include sensors such as LIDAR/SONAR/RADAR sensors, GPS sensors, communication devices, navigation devices, and various payload delivery systems. For example, and without limitation, real-time commands include instructions that when executed by the onboard control system cause a camera to capture an image, a communications system to transmit data, or a processing component to program or configure one or more processing elements.

UAV 10 is depicted by way of example, not limitation. Although much of the present disclosure is described with respect to unmanned aerial vehicles, it will be appreciated that embodiments of the disclosed technology may be used with any unmanned vehicle (UV), such as unmanned marine vehicles and unmanned ground vehicles. For example, the disclosed control systems may be used with unmanned boats, unmanned submarines, unmanned cars, unmanned trucks, or any other unmanned vehicle capable of locomotion.

Figure 2:
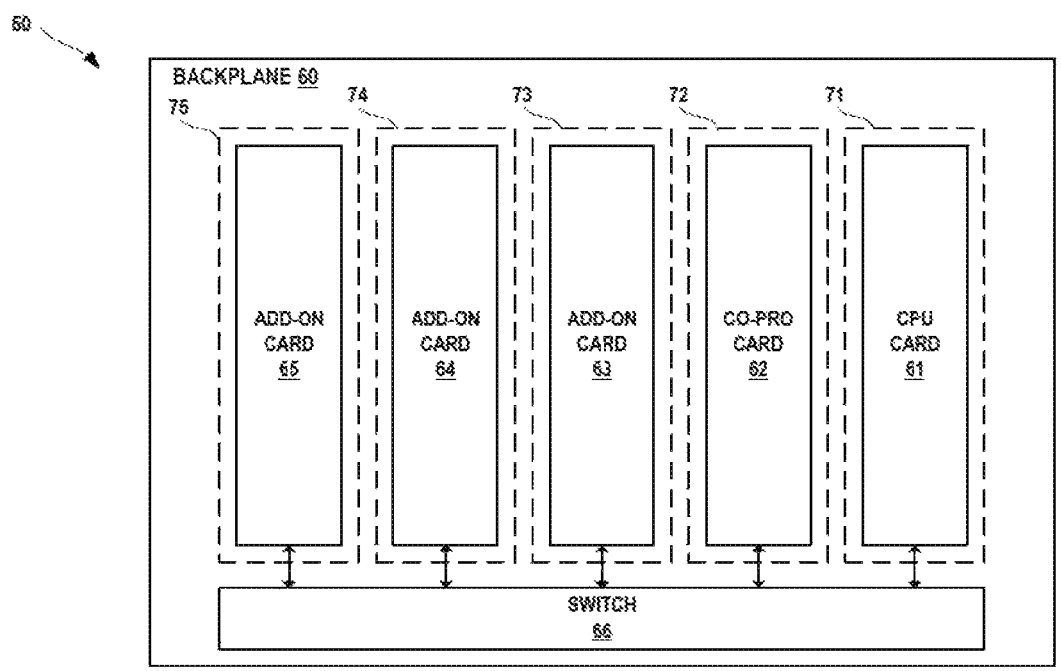
FIG. 2 is a block diagram depicting an example of a typical control system for a UAV including a backplane and card architecture.

FIG. 2 is a block diagram depicting an example of a typical control system 50 for a UAV. In this example, a control system is formed using a backplane 60 having a plurality of card slots 71, 72, 73, 74, 75. Each card slot is configured to receive a card meeting a predefined set of mechanical and electrical standards. Each card includes one or more circuit boards, typically including one or more integrated circuits configured to perform specific vehicle or mission control functions. The card slot provides structural support for the card, as well as an electrical connection between the card and an underlying bus. A particular example is depicted having a CPU card 61 installed in a first card slot 71, a co-processor card 62 installed in a second card slot 72, and add-on cards 63, 64, 65 installed in card slots 73, 74, 75, respectively. By way of example, CPU card 61 may include a circuit board having a processor, PCI circuitry, switching circuitry, and an electrical connector configured to both structurally and electrically connect card 61 to card slot 71. Similarly, co-processor card 62 may include a processor, PCI circuitry, switching circuitry, and a connector.

Add-on cards 63, 64, 65 may include any number and type of cards configured to perform one or more vehicle and/or mission functions. Examples of add-on cards include input/output (I/O) cards, network cards, piloting and navigation function cards, sensor interface cards (e.g., cameras, radar, etc.), payload delivery systems control cards, graphics processing unit (GPU) cards, and any other card for a particular type of vehicle and/or mission function.

Typical backplane architectures like that in FIG. 2 include a switch 66 that allows each card to communicate with cards in any other slot. Numerous examples including various standards exist to define different types of backplane architectures. For example, although switch 66 is shown separate from the card slots 71, 72, 73, 74, 75, some architectures may place a central switch in a particular slot of the backplane. In each case, the node devices can communicate with one another via the switch. While five card slots are depicted in FIG. 2, a backplane may include any number of card slots.

An onboard control system for a UAV utilizing a backplane architecture like that of FIG. 2 may be effective in providing some function control. Additionally, such an architecture may provide some configurability through hardware changes. However, traditional backplane architectures may have a number of drawbacks in implementations for UAVs. For example, the structural performance of a backplane coupling to a plurality of cards through a combined electrical and mechanical connection may not be well-suited to the high-stress environments of some UAVs. Mechanical and/or electrical failures may occur for one or more cards in the backplane due to vibrations, temperatures, and other factors. Additionally, such architectures provide a limited processing capability, while requiring considerable space and weight. Each card typically includes its own circuit board including connectors, switching circuitry, communication circuitry, etc. Because each circuit board requires its own circuitry for these common functions, a backplane architecture may provide relatively high weight and space requirements. Moreover, the computing ability and capacity of these types of systems is typically limited by a multiple card approach. Communication between the cards and between the various processing elements may lead to reduced computational abilities.

Figure 3:
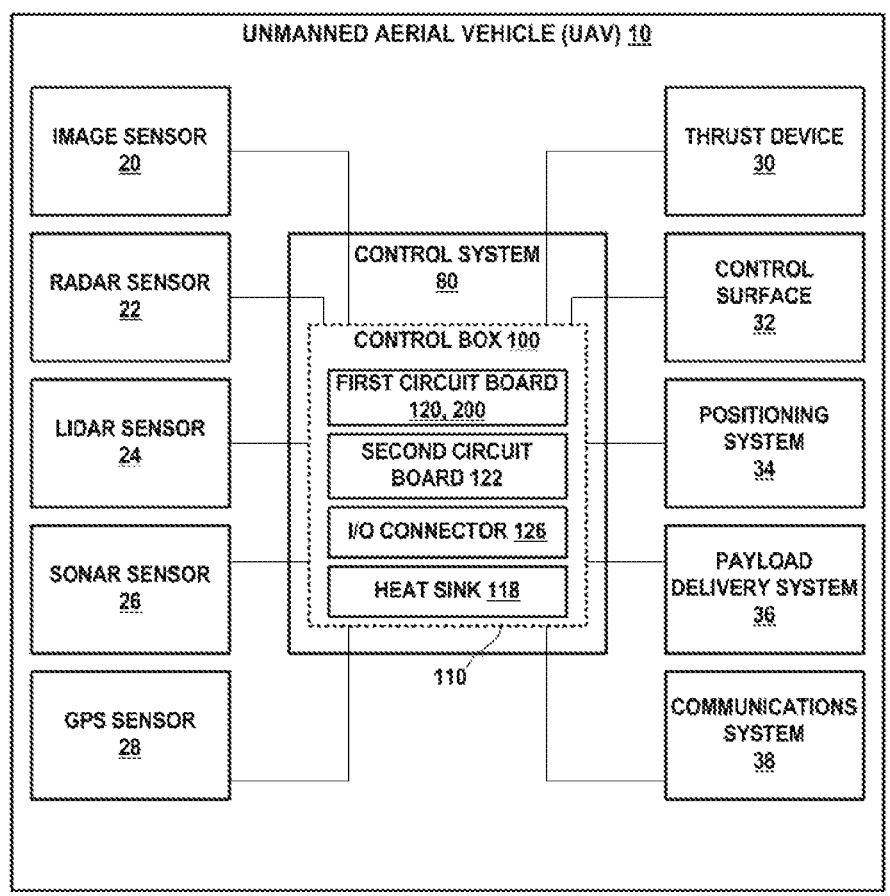
FIG. 3 is a block diagram depicting an example of a UAV having an onboard control system in accordance with embodiments of the present disclosure.

FIG. 3 is a block diagram depicting an unmanned aerial vehicle (UAV) 10 including a control system 80 in accordance with embodiments of the disclosed technology. Control system 80 includes a control box 100 that provides centralized control of vehicle and mission functions. The control box includes a housing 110 defining an interior 112. A first circuit board 120 and second circuit board 122 are disposed within the interior of housing 110, and an input/output ("I/O") connector 126 extends through the housing 110 (such as from the second circuit board 122) as described hereinafter. Control box 100 includes a heat sink 118 provided to dissipate heat from the electric components of the control box 100. In example embodiments, heat sink 118 may form at least a portion of housing 110 as described hereinafter. Control system 80 may include additional components such as additional control units or other elements that perform vehicle or mission control processes.

In some implementations, first circuit board 120 comprises a control module for controlling vehicle and mission management functions of UAV 10, and second circuit board 122 comprises a carrier module for providing a communication interface between the control unit and various PM devices and secondary devices of the UAV.

In some examples, the first circuit board includes multiple heterogeneous processing systems, each having a reconfigurable processing architecture to provide management of the various vehicle and mission functions. The multiple heterogeneous processing systems with reconfigurable functionality are suited to the diverse functions performed by unmanned airborne vehicles, as well as the high level of certifications typically needed for these vehicles.

In example embodiments, the second circuit board 122 is a carrier module providing an interface between the first circuit board 120 and the various PM devices 14 and secondary devices 12 of UAV 10. For example, FIG. 3 depicts a set of PM devices including a thrust device 30, control surface 32, and positioning system 34. Additionally, FIG. 3 depicts a set of secondary devices including an image sensor 20, a radar sensor 22, a LIDAR sensor 24, a sonar sensor 26, a GPS sensor 28, a payload delivery system 36, and a communication system 38. The second circuit board 122 may include an I/O connector that connects to a corresponding I/O connector of the first circuit board, as well as an I/O connector that extends from the housing. Additionally, the second circuit board may include a plurality of sensor connectors that extend from the housing. The second circuit board may provide a communications or input/output (I/O) interface including associated electronic circuitry that is used to send and receive data. More specifically, the communications interface can be used to send and receive data between any of the various integrated circuits of the second circuit board, and between the second circuit board and other circuit boards. For example, the item interface may include I/O connector 126, I/O connector 238, and/or I/O connector 124. Similarly, a communications interface at any one of the interface circuits may be used to communicate with outside components such as another aerial vehicle, a sensor, other vehicle devices, and/or ground control. A communications interface may be any combination of suitable wired or wireless communications interfaces.

In some examples, control box 100 may include additional components. For example, a third circuit board such as a mezzanine card can be provided within control box 100 in another embodiment. The third circuit board may include one or more nonvolatile memory arrays in some examples. For example, a solid-state drive (SSD) may be provided as one or more integrated circuits on a mezzanine card. Moreover, control box 100 may include additional circuit boards to form a control module as well as additional circuit boards to form additional carrier modules.

Figure 4:
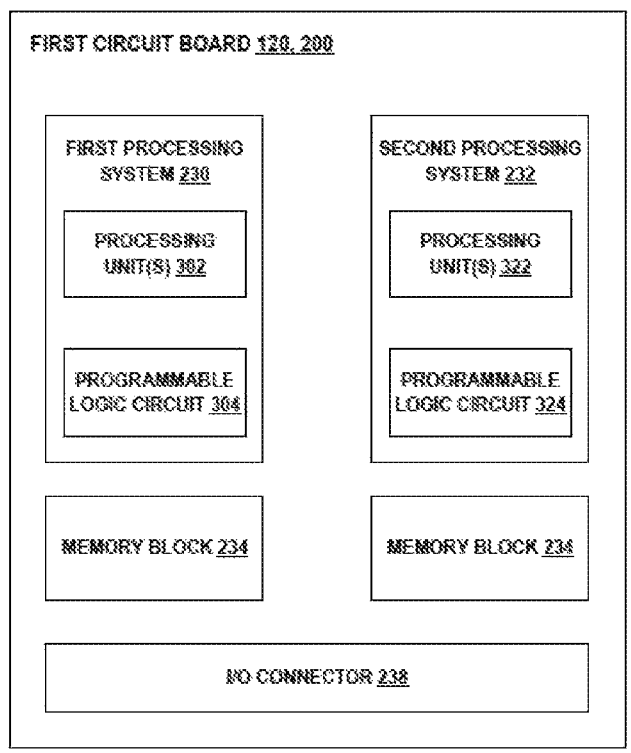
FIG. 4 is a block diagram depicting a first circuit board comprising a control module for a control box of the onboard control system in accordance with embodiments of the present disclosure.

FIG. 4 is a block diagram describing a first circuit board 120 in accordance with example embodiments of the disclosed technology. In FIG. 4, first circuit board 120 is configured as a control module (e.g., control board) for an unmanned aerial vehicle (UAV). In example embodiments, first circuit board 120 is a system-on-module (SOM) card 200. First circuit board 120 includes a first processing system 230, second processing system 232, memory blocks 234, and an I/O connector 238.

The first and second processing systems can include or be associated with, any suitable number of individual microprocessors, power supplies, storage devices, interfaces, and other standard components. The processing systems can include or cooperate with any number of software programs (e.g., vehicle and mission control processes) or instructions designed to carry out the various methods, process tasks, calculations, and control/display functions necessary for operation of the aerial vehicle 10. Memory blocks 234 may include any suitable form of memory such as, without limitation, SDRAM, configured to support a corresponding processing system. For example, a first memory block 234 may be configured to support first processing system 230 and a second memory block 234 may be configured to support second processing system 232. Any number and type of memory block 234 may be used. By way of example, four memory blocks each comprising an individual integrated circuit may be provided to support the first processing system 230 and two memory blocks may be provided to support the second processing system 232. I/O connector 238 extends from a first surface of first circuit board 122 to provide an operative communication link to second circuit board 122.

First processing system 230 and second processing system 232 form a heterogeneous and reconfigurable computing architecture in example embodiments of the disclosed technology, suitable to the diverse and stable needs of UAV 10. First processing system 230 includes one or more processing units 302 forming a first processing platform and one or more programmable logic circuits 304 forming a second processing platform. By way of example, one or more processing units 302 may include a central processing unit and programmable logic circuit 304 may include a volatile programmable logic array such as a RAM-based field programmable gate array (FPGA). Any number and type of processing unit may be used for processing units 302. Multiple processing units 302 and programmable logic circuit 304 may be provided within a first integrated circuit, referred to generally as a processing circuit in some embodiments.

Second processing system 232 includes one or more processing units 322 forming a third processing platform and one or more programmable logic circuits 324 forming a fourth processing platform. By way of example, one or more processing units 302 may include a co-processing unit and programmable logic circuit 324 may include a flash-based FPGA. Any number and type of processing unit may be used for processing units 324. One or more processing units 324 and programmable logic circuit 324 may be provided within the second integrated circuit, also referred to as a processing circuit in some embodiments.

By providing different processing unit types as well as different programmable logic circuit types in each processing system, first circuit board 120 provides a heterogeneous computing system uniquely suited to the processing, reliability, and operational requirements of high-stress application UAVs. For example, the RAM-based and flash-based FPGA technologies are combined to leverage the strengths of both for UAV applications. The unique abilities of heterogeneous processing units 302 and 322 and heterogeneous programmable logic circuits 304 and 324 support both hardware and software-partitioned operating environments. Vehicle and mission management functions can be allocated to different partitions according to criticality and performance needs. This provides a control and monitor architecture suitable for critical operations. For example, an on/off or red/green architecture for control of irreversible critical functions is provided. By way of further example, one or more of the field programmable gate arrays may be configured to provide a fabric accelerator for onboard sensor processing.

Referring now to FIGS. 5 through 18, further embodiments of improved control boxes 100 and components thereof are generally provided. As discussed, control box 100 in accordance with the present disclosure generally houses the various electrical/computing components which control operation of an unmanned aerial vehicle ("UAV"), and the control box 100 is thus generally mounted on the UAV. Control boxes 100 in accordance with the present disclosure are particularly advantageous due to their modular design, wherein various components of the control boxes 100 such as the heat sink, cover, and/or stiffener, as discussed herein, are each interchangeable with various different designs for each such component. Certain features as discussed herein help to facilitate such modularity. Additionally, as discussed herein, various features of such control boxes 100 such as the heat sink, the stiffener, and the system on module ("SOM") circuit board include advantageous heat transfer features for transferring heat from the SOM circuit board and from the control box 100 generally. Other advantageous features will be discussed herein.

A control box 100 in accordance with the present disclosure may define a lateral direction 102, a longitudinal direction 104, and a transverse direction 106, as shown. Such directions 102, 104, 106 may together define an orthogonal coordinate system for the control box 100.

Control box 100 may include a housing 110 which defines an interior 112. The housing 110 in exemplary embodiments includes a cover 114 and one or more stiffeners 116. In some embodiments, only a single stiffener 116 is utilized in a control box 100, although in alternative embodiments more than one stiffener 116 may be utilized. In embodiments wherein the housing 110 includes a cover 114 and stiffener(s) 116, at least one such stiffener 116 is removably connected in contact with the cover 114, and the stiffeners 116 are stacked on each other and the housing 110 along the transverse direction 106. Control box 100 may further include a heat sink 118. The heat sink 118 may be removably connected to the housing 110, such as in contact with one of the plurality of stiffeners 116. The heat sink 118 may further be stacked on the stiffeners 116 and the housing 110 along the transverse direction 106.

One or more circuit boards may be disposed within the interior 112. For example, a first circuit board 120 may be disposed in the interior 112. In exemplary embodiments, the first circuit board 120 is a system on module ("SOM") circuit board 200 as discussed herein. Such first circuit board 120 may in exemplary embodiments be positioned between the housing 110 and the heat sink 118, such as between a stiffener 116 and the heat sink 118. Further, the first circuit board 120 may be in contact with the heat sink 118 such that heat from the first circuit board 120 is dissipated from the first circuit board 120 through the heat sink 118. Additionally, the first circuit board 120 may be in contact with a stiffener 116.

For example, the first circuit board 120 may include one or more computing components. Such computing components may include a first processing system 230, a second processing system 232, and/or one or more memory blocks 234, all of which are discussed in detail herein, such as in the context of SOM circuit board 200. Further, a thermal interface material 236 (discussed in detail below in the context of SOM circuit board 200) may be disposed on one or more of such computing components. In exemplary embodiments, the first circuit board 120, such as the thermal interface material 236 disposed on one or more of the computing components, may contact the heat sink 118 and/or a stiffener 116.

In some embodiments, the thermal interface material 236 may be in contact with the heat sink 118. In particular, the thermal interface material 236 that is disposed on one or more computing components (such as first processing system 230, a second processing system 232, and/or one or more memory blocks 234 that are mounted on a first face surface 210 of the circuit board 120 as discussed below in the context of the SOM circuit board 200) may be in contact with the heat sink 118, such as a base 130 thereof.

Additionally or alternatively, the stiffener 116 may include a plurality of fingers 140. Fingers 140 are generally planer inner surfaces of the stiffener 116 which contact other components for support and heat transfer purposes. The first circuit board 120 may contact such fingers 140. In particular, the thermal interface material 236 that is disposed on one or more computing components (such as one or more memory blocks 234 that are mounted on a second face surface 212 of the circuit board 120 as discussed below in the context of the SOM circuit board 200) may be in contact with the fingers 140.

In exemplary embodiments, the stiffener 116 includes an outer frame 142 and one or more cross-members 144. Stiffener 116 may additionally include fingers 140. When first circuit board 120 contacts stiffener 116, the first circuit board 120 may contact the outer frame 142 and/or one or more of the cross-members 144, and may further contact fingers 140 as discussed above.

Figure 5:
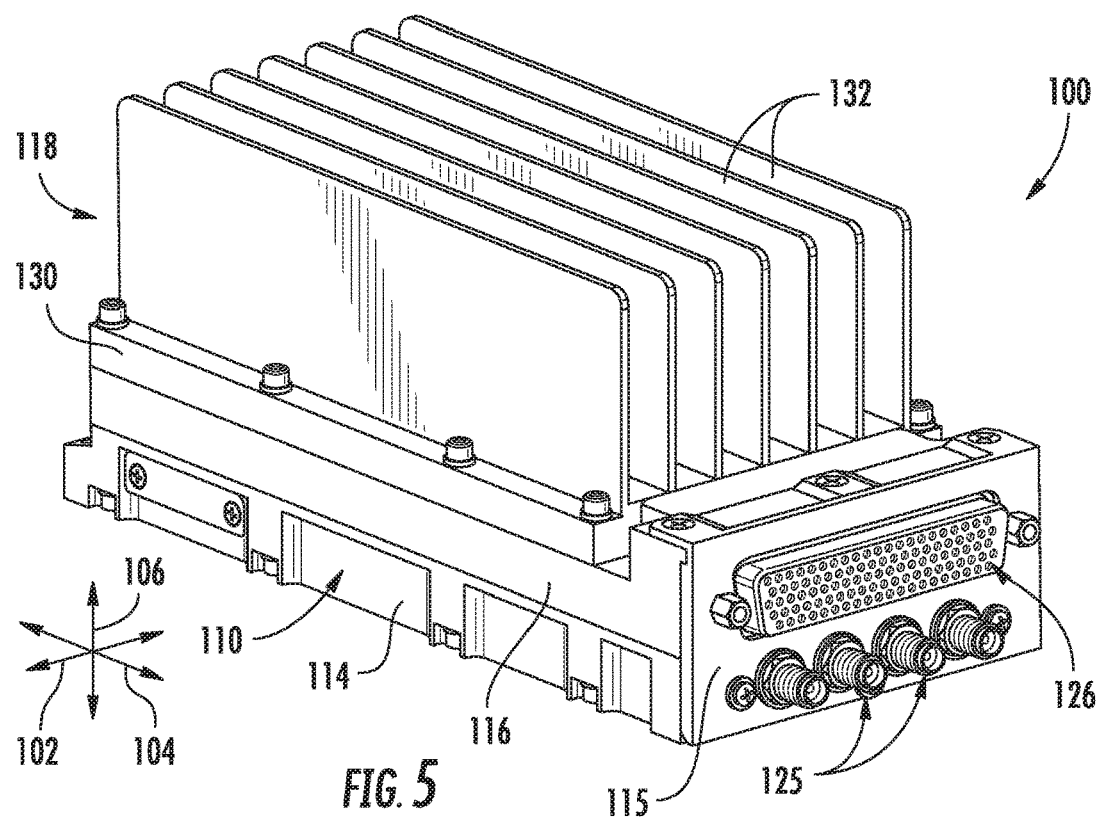
FIG. 5 is a perspective view of a control box in accordance with embodiments of the present disclosure.
Figure 6:
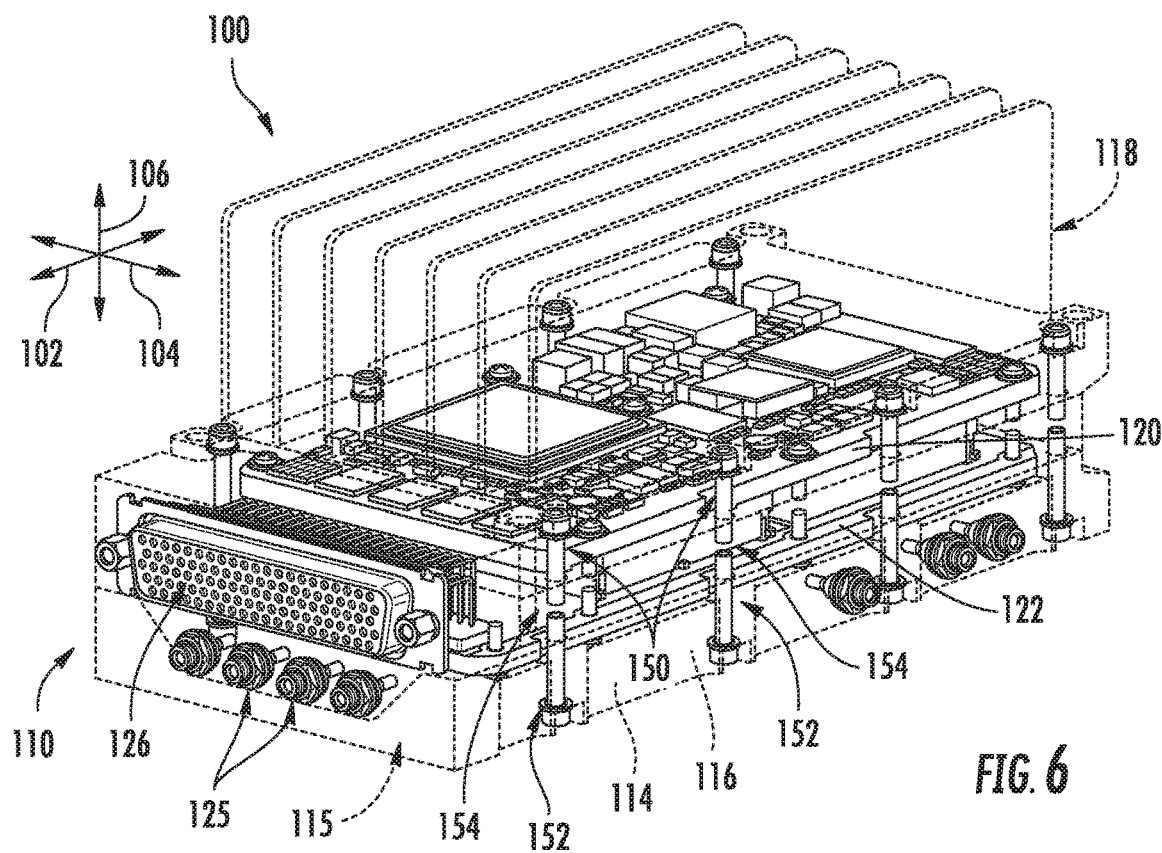
FIG. 6 is a perspective view showing internal components of a control box in accordance with embodiments of the present disclosure.
Figure 7:
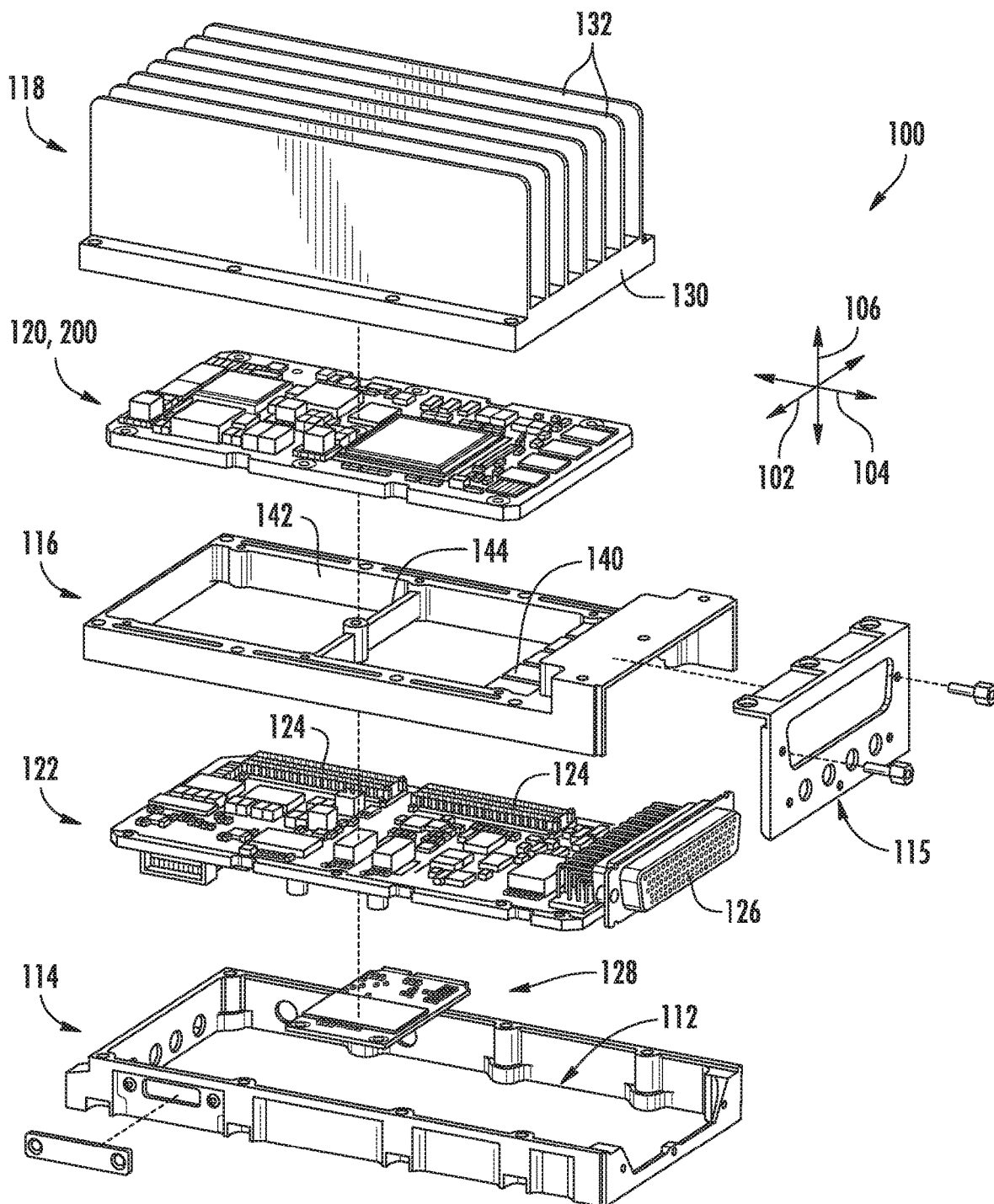
FIG. 7 is an exploded perspective view of a control box in accordance with embodiments of the present disclosure.
Figure 8:
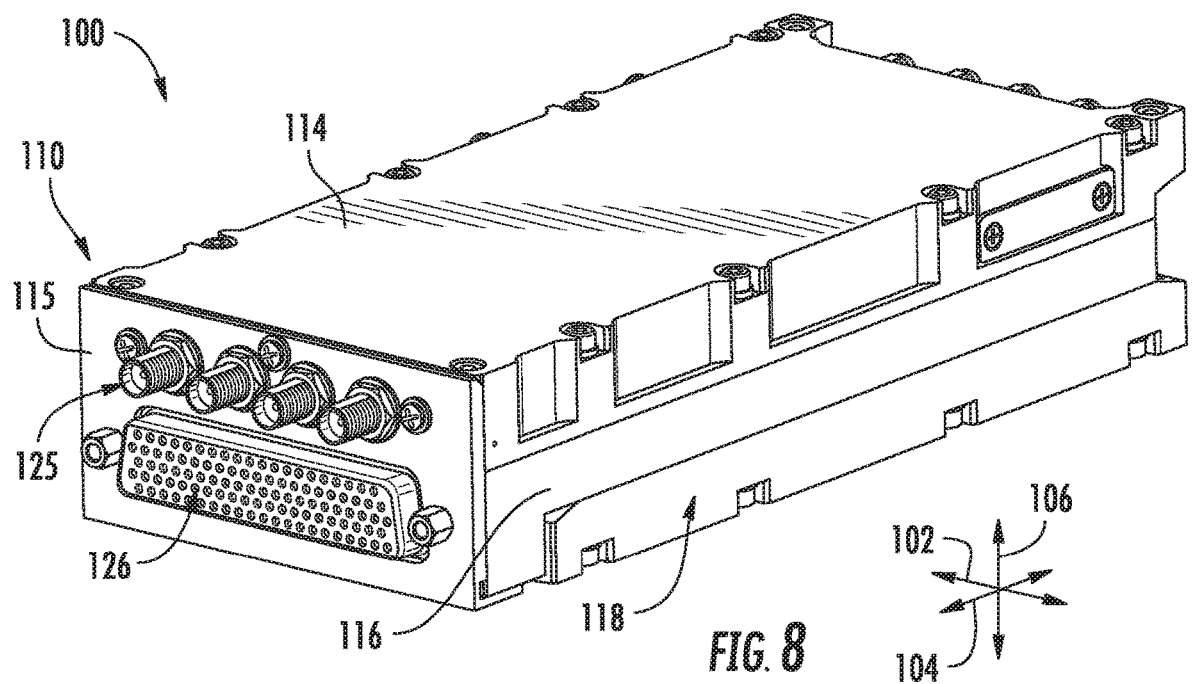
FIG. 8 is a perspective view of a control box in accordance with other embodiments of the present disclosure.
Figure 9:
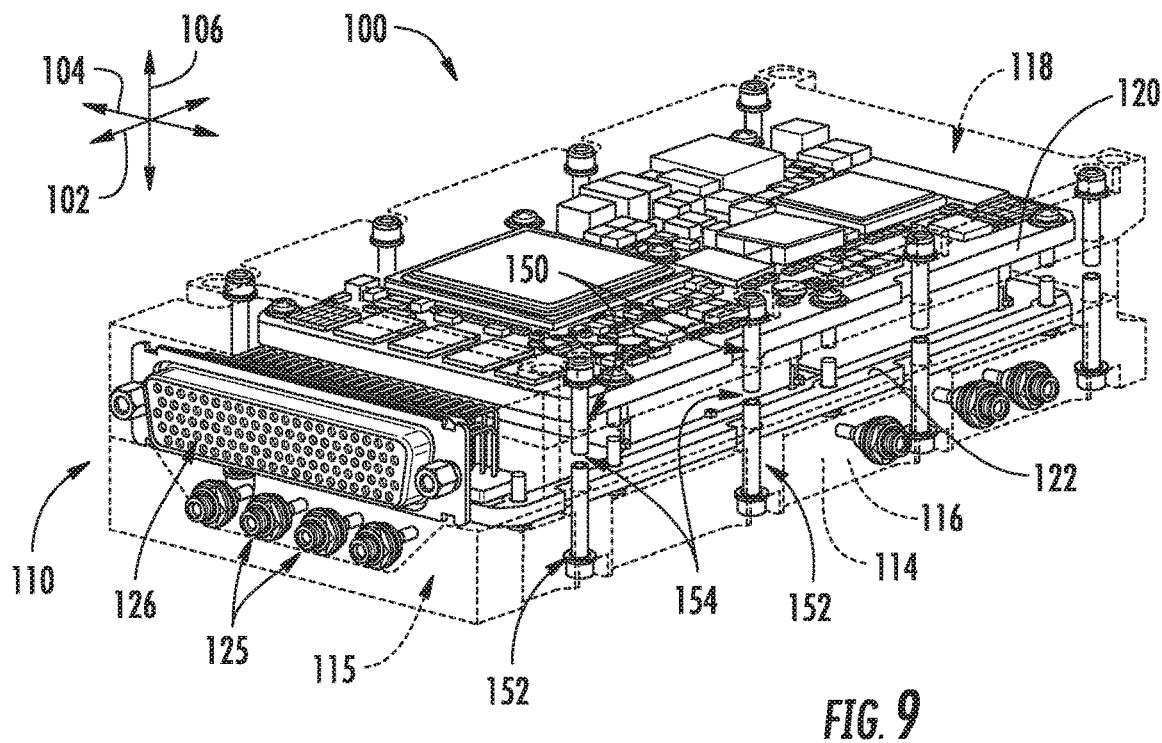
FIG. 9 is a perspective view showing internal components of a control box in accordance with other embodiments of the present disclosure.
Figure 10:
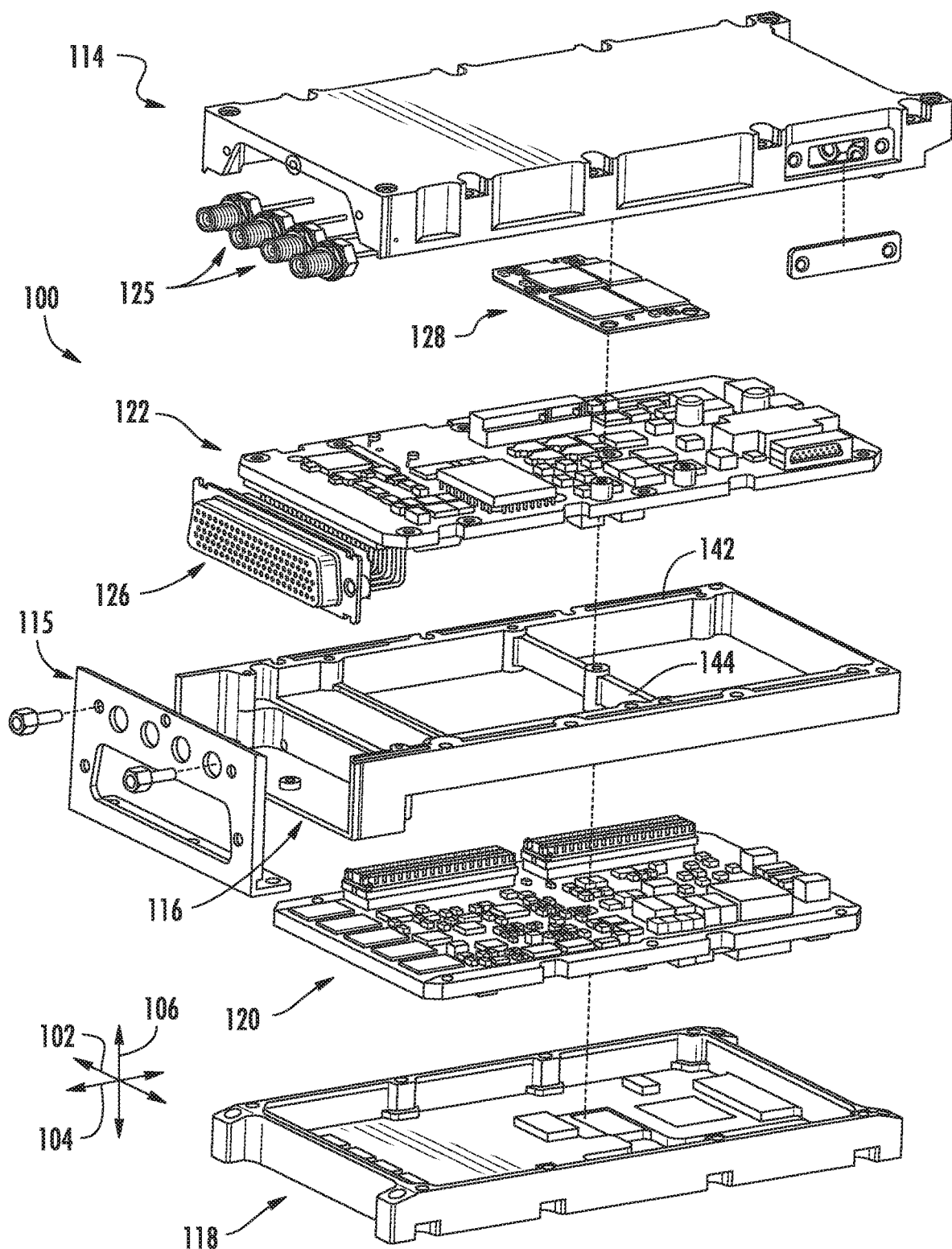
FIG. 10 is an exploded perspective view of a control box in accordance with other embodiments of the present disclosure.
Figure 11:
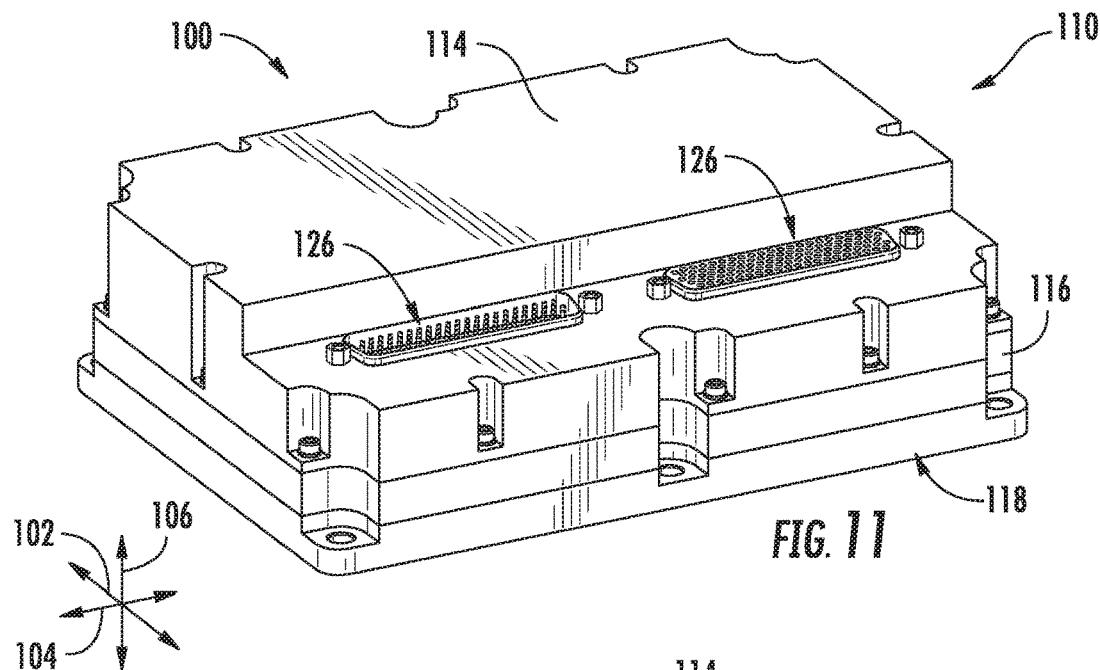
FIG. 11 is a perspective view of a control box in accordance with further embodiments of the present disclosure.
Figure 12:
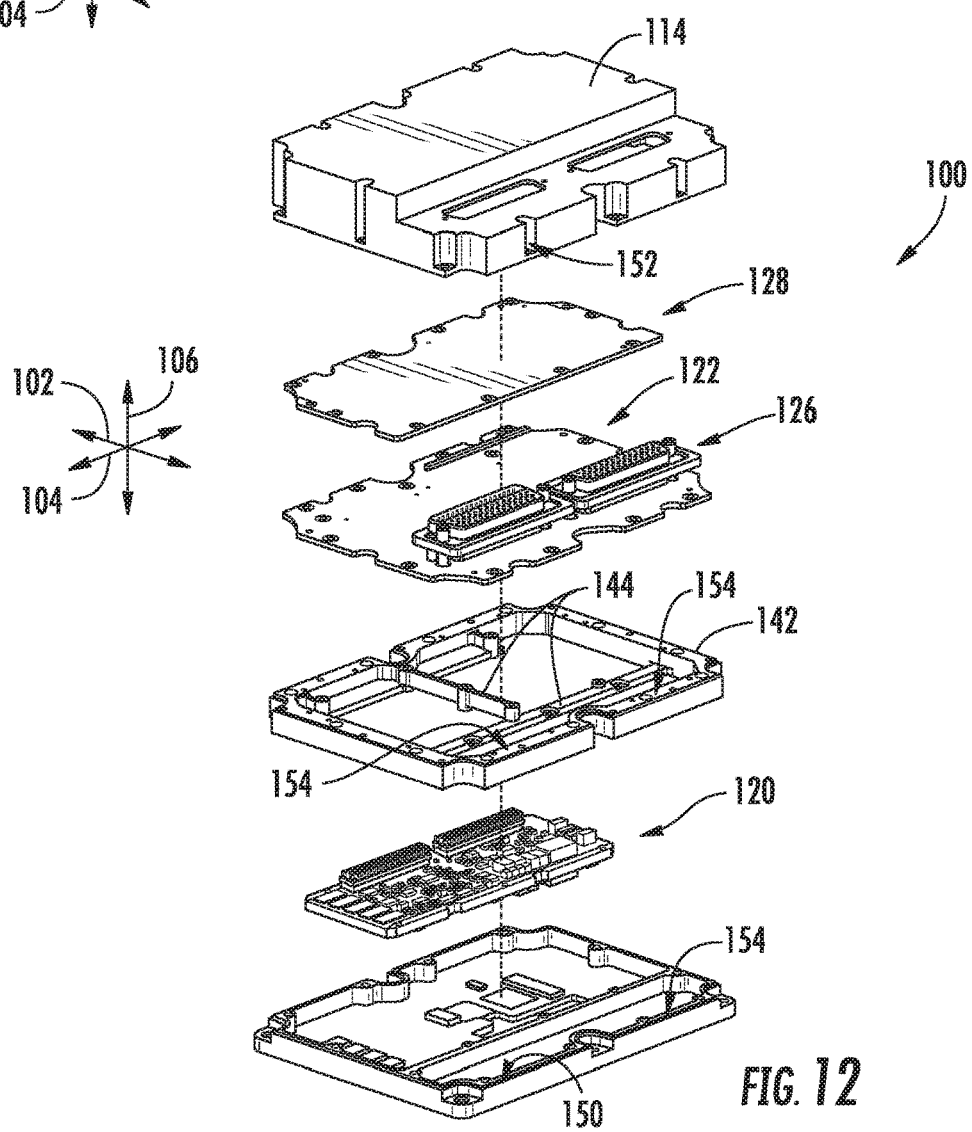
FIG. 12 is an exploded perspective view of a control box in accordance with further embodiments of the present disclosure.
Figure 13:
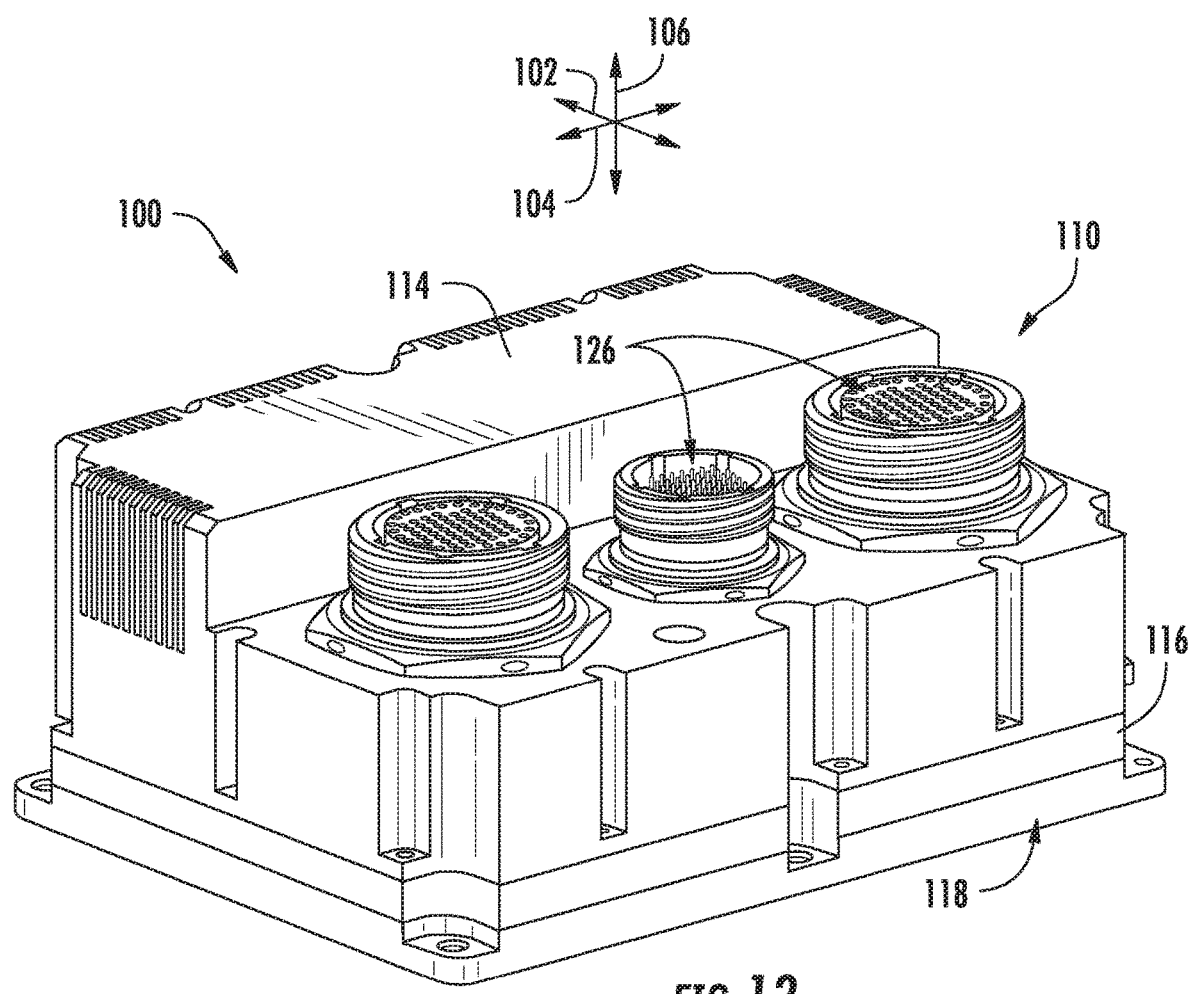
FIG. 13 is a perspective view of a control box in accordance with still further embodiments of the present disclosure.
Figure 14:
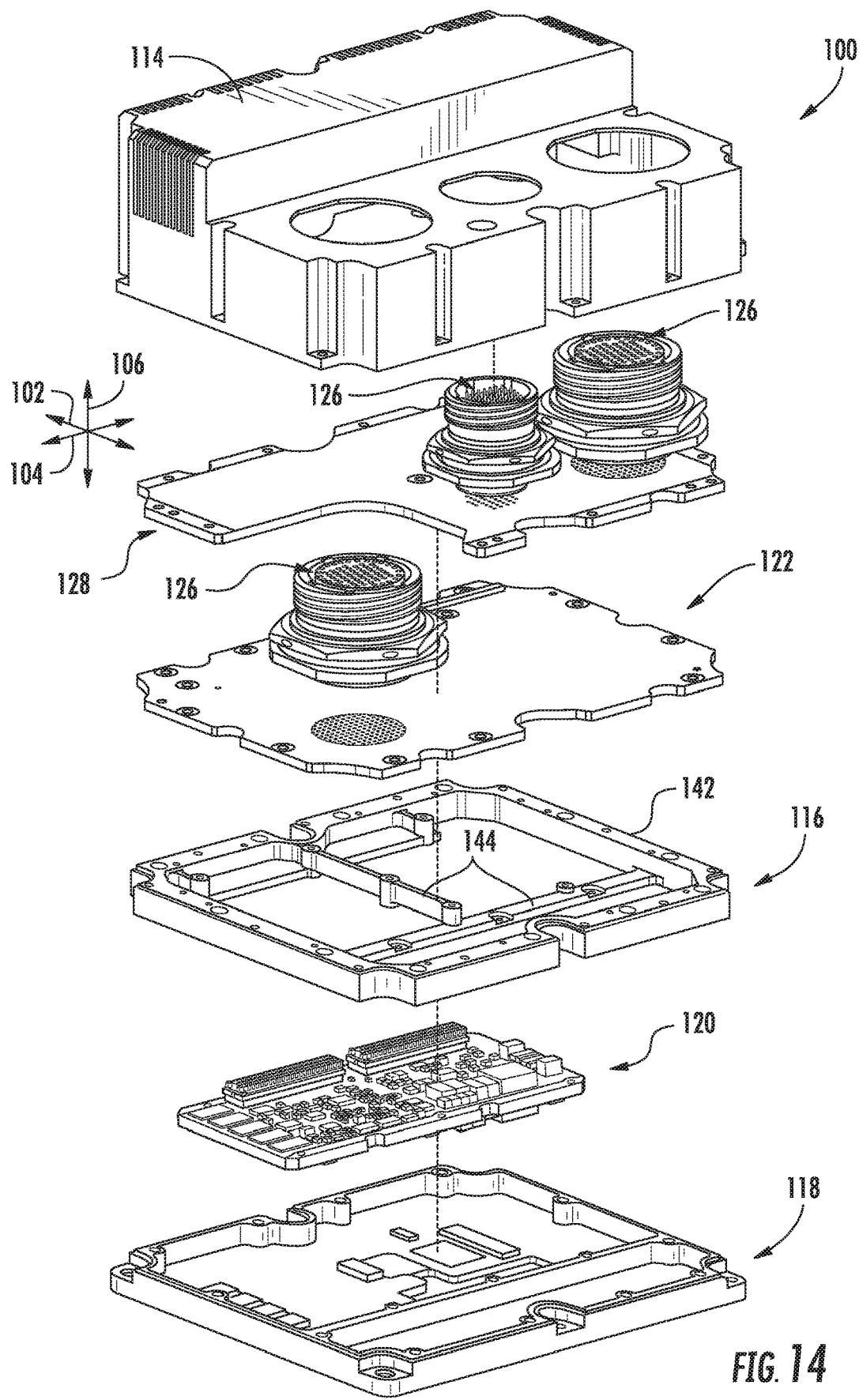
FIG. 14 is an exploded perspective view of a control box in accordance with still further embodiments of the present disclosure.

In exemplary embodiments, heat sink 118 is formed from a metal. Heat sink 118 may include a base 130. Base may in exemplary embodiments be in contact with the first circuit board 120, such as components thereof as discussed above. Further, in some exemplary embodiments as illustrated in FIGS. 5 through 7, heat sink 118 may include a plurality of fins 132 which extend externally from the base 130. In these embodiments, heat sink 118 may provide convective heat transfer from the control box 100 via fins 132. In other embodiments, as illustrated in FIGS. 8 through 14, no fins 132 may be provided and heat sink 118 may provide conductive heat transfer from the control box 100 via contact of the base 130 with other components in, for example, the subject UAV to which the control box 100 is mounted. In still other embodiments, heat sink 118 may further include single use or reversible phase change materials, liquid cooling materials, and/or other suitable components for facilitating heat transfer.

Control box 100 may further include a second circuit board 122. Second circuit board 122 may, for example, be a carrier card-type circuit board which generally includes communications related components, such as sonar, radar, GPS, radio, etc. related components. The second circuit board may be disposed within the interior 112. For example, such second circuit board 122 may in exemplary embodiments be positioned between the cover 114 and the stiffener 116. Further, the second circuit board 122 may be in contact with the stiffener 116.

In exemplary embodiments, second circuit board 122 is in operative communication with first circuit board 120. For example, second circuit board 122 may further include one or more input/output connectors 124 which are positioned on the second circuit board 122 to operatively contact mating input/output connectors (such as connectors 238 in SOM circuit board 200 embodiments) of the first circuit board 120.

In some embodiments, second circuit board 122 may further include one or more sensor connectors 125. Such sensor connectors 125 may extend from the housing 110, such as along the longitudinal direction 104 as shown in FIGS. 5 through 10 or in another suitable direction. These sensor connectors 125 may be ports for connection of the second circuit board 122 to suitable external sensors or other secondary devices 12 (such as those discussed herein) which may, for example, be mounted on the UAV on which the control box 100 is mounted.

Control box 100 may additionally include one or more input/output connectors 126 which extend from the housing 110. In exemplary embodiments, one or more of such connector(s) 126 are components of the second circuit board 122. Such input/output connectors 126 may connect the control box 100 and components thereof to other components of, for example, the UAV on which the control box 100 is mounted. In some embodiments, as illustrated in FIGS. 5 through 10, the input/output connector(s) 126 extend from the housing 110 along the longitudinal direction 104, such as through an end faceplate 115 of the housing 110. In other embodiments, as illustrated in FIGS. 11 through 14, the input/output connector(s) 126 extend from the housing 110 along the transverse direction 106, such as through the cover 114.

In some embodiments, control box 100 may further include a mezzanine card 128. Mezzanine card 128 may be disposed within interior 112, and may be in operative communication with the second circuit board 122. Mezzanine card 128 may, for example, be disposed between second circuit board 122 and cover 114. In some embodiments, one or more of the input/output connectors 126 are components of the mezzanine card 128.

As shown, the heat sink 118 and components of the housing 110 may include through-holes. The various through-holes may advantageously align to facilitate the modularity of the various components of control box 100.

For example, a plurality of through holes 150 may extend through the base 130 of heat sink 118, such as along the transverse direction 106. Such through holes 150 may be arranged in a pattern. Further, a plurality of through holes may extend through the housing 110, such as along the transverse direction 106. Such through holes may be arranged in a pattern. Such through holes may, for example, include through holes 152 which extend through the cover 114 along the transverse direction 106 and in a pattern, and through holes 154 which extend through the stiffener 116 along the transverse direction 108 and in a pattern. In exemplary embodiments, the patterns of through holes in the base 130 and housing 110, such as the through holes 150, 152, and 154, are identical. Accordingly, fasteners may be inserted through the through holes 150, 152, 154 to fasten such components of the control box 100 together. Notably, such identical pattern may extend to a variety of different types of heat sinks 118 and housings 110 (and covers 114 and stiffeners 116 thereof), such that different versions of such components can be swapped with each other in a module fashion.

Figure 15:
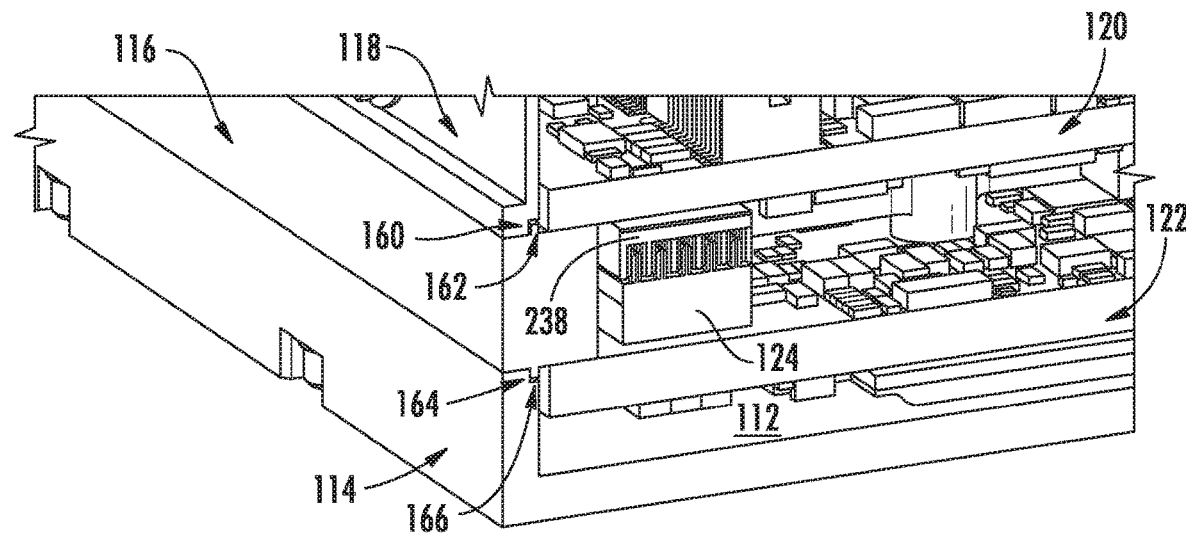
FIG. 15 is a sectional view of a control box in accordance with embodiments of the present disclosure.
Figure 16:
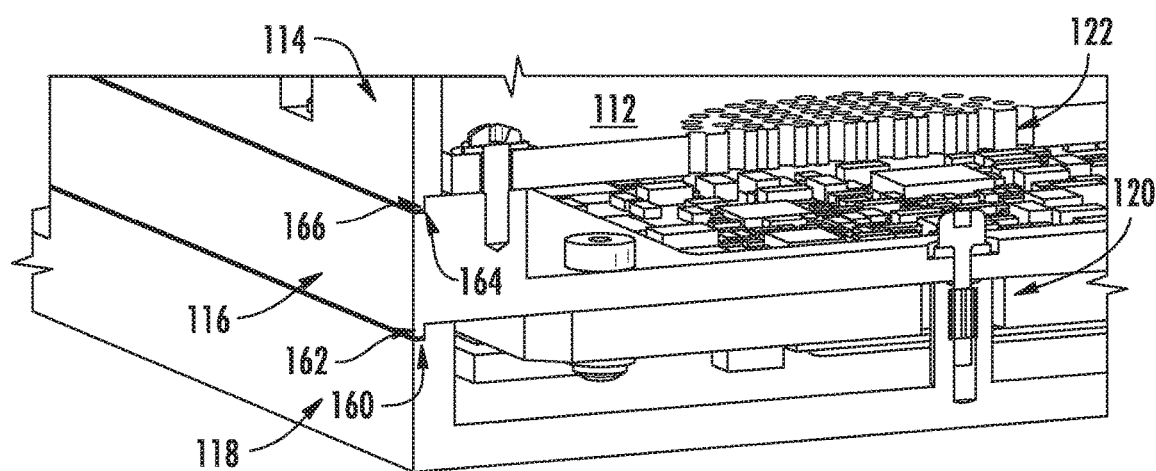
FIG. 16 is a sectional view of a control box in accordance with other embodiments of the present disclosure.

When the heat sink 118 contacts the housing 110, such as the stiffener 116 thereof, such components may fit together using a "tongue-and-groove" type feature. Such feature advantageously orients the components relative to one another to ensure a proper fit, and also advantageously acts as an electro-magnetic interference ("EMI") filter. For example, as shown in FIGS. 15 and 16, a groove 160 may be defined in the base 130. In some embodiments, the groove 160 may be an external groove, as shown in FIG. 16. Alternatively, the groove 160 may be an internal groove, as shown in FIG. 15. A mating tab 162 may extend from the housing 110, such as the stiffener 116 thereof. The tab 162 may extend into the groove 160 when the heat sink 118 is connected to the housing 110, such as to the stiffener 116 thereof.

In embodiments wherein a cover 114 and stiffener are utilized, such components may also fit together using a "tongue-and-groove" type feature. Such feature advantageously orients the components relative to one another to ensure a proper fit, and also advantageously acts as an electro-magnetic interference ("EMI") filter. For example, as shown in FIG. 16, a groove 164 may be defined in the stiffener 116. In some embodiments as shown, the groove 164 may be an external groove. Alternatively, the groove 164 may be an internal groove. A mating tab 166 may extend from the cover 114. Alternatively, as illustrated in FIG. 15, the groove 164 may be defined in the cover 114, and the tab 166 may be defined in the stiffener 116. The tab 166 may extend into the groove 164 when the stiffener 116 is connected to the cover 114.

Figure 17:
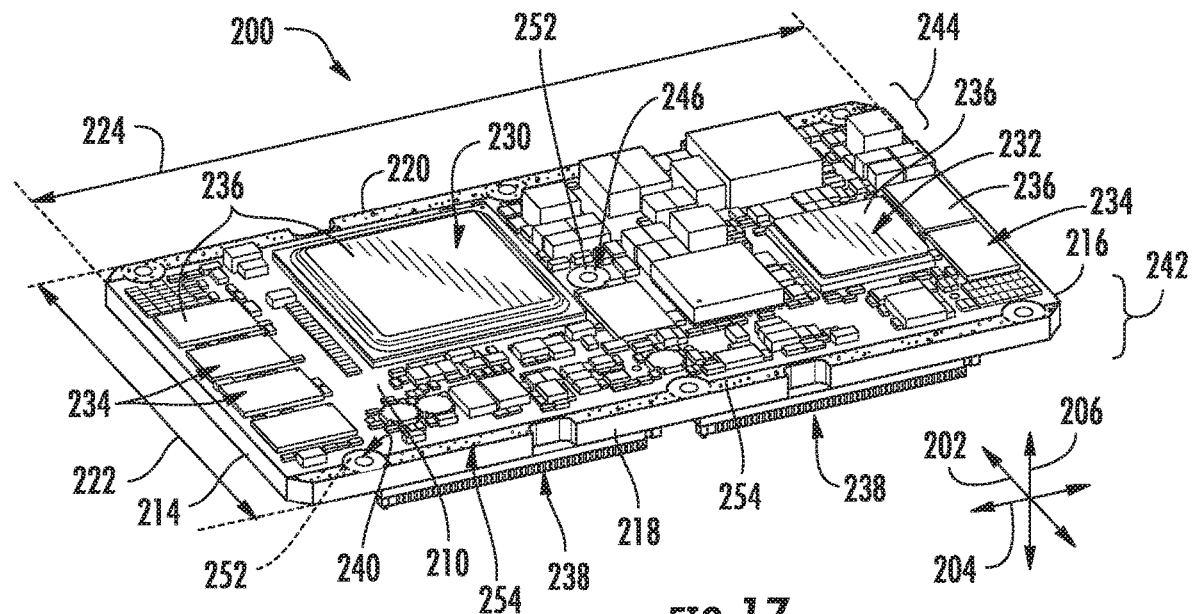
FIG. 17 is a perspective top view of a system-on-module circuit board in accordance with embodiments of the present disclosure.
Figure 18:
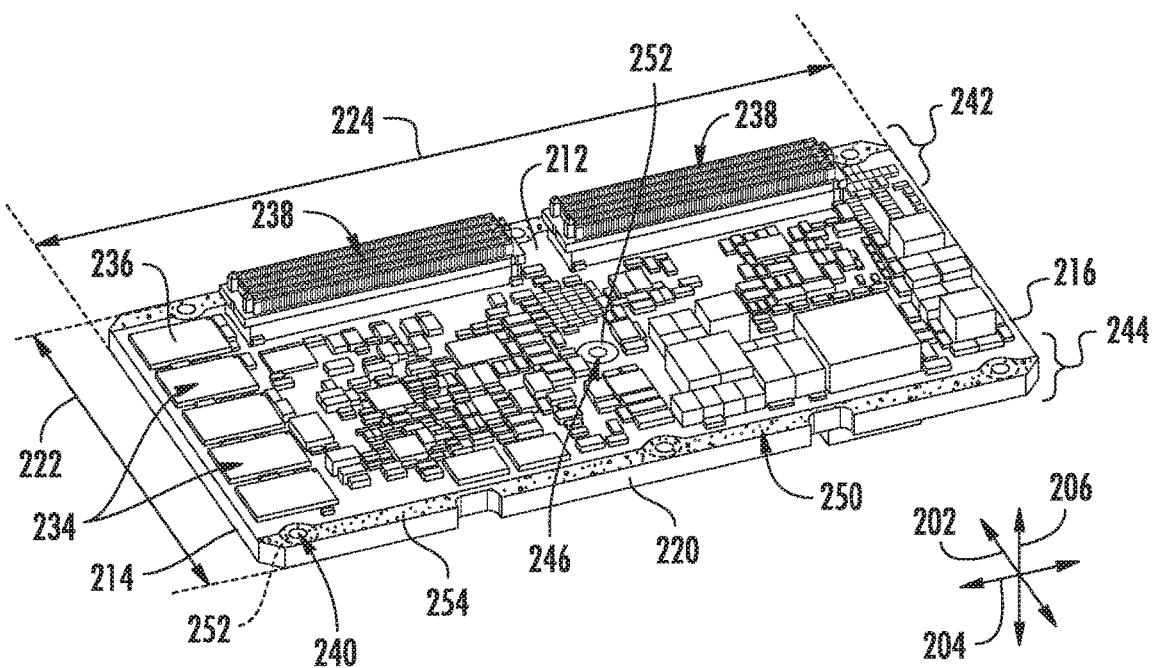
FIG. 18 is a perspective bottom view of a system-on-module circuit board in accordance with embodiments of the present disclosure.

Referring now to FIGS. 17 and 18, a control box 100 in accordance with the present disclosure may include a system on module ("SOM") circuit board 200, which may be the first circuit board 120 as discussed above. The SOM circuit board 200 may define a lateral direction 202, a longitudinal direction 204, and a transverse direction 206, as shown. Such directions 202, 204, 206 may together define an orthogonal coordinate system for the SOM circuit board 200. When the SOM circuit board 200 is installed in a control box 100, the directions 202, 204, 206 may correspond to the respective directions 102, 104, 106.

SOM circuit board 200 may have a main body 208 which includes a plurality of outer surfaces. For example, main body 208 includes a first face surface 210 and a second opposing face surface 212, both of which generally extend within planes defined by the lateral direction 202 and longitudinal direction 204. Main body 208 further includes a first end surface 214 and an opposing second end surface 216, both of which generally extend within planes defined by the lateral direction 202 and the transverse direction 206. Main body 208 further includes a first side surface 218 and an opposing second side surface 220, both of which generally extend within planes defined by the longitudinal direction 204 and the transverse direction 206.

In generally, the SOM circuit board 200 and main body 208 thereof has a hyperrectangular shape, as shown. Accordingly, first and second end surface 214, 216 also each have a length 222, which is a maximum length along the lateral direction 202. First and second side surfaces 218, 220 each also have a length 224, which is a maximum length along the longitudinal direction 204. As shown, in exemplary embodiments, the maximum lengths 224 are greater than the maximum lengths 222.

The SOM circuit board 200 may further include a plurality of computing components. Each computing component may be mounted on the main body 208, such as on the first face surface 210 or second face surface 212. For example, the computing components may include a first processing system 230, a second processing system 232, and a plurality of memory blocks 234. Notably, the first and second processing systems 230, 232 and the memory blocks 234 may in exemplary embodiments be integrated together in a cohesive computing system with the two processing systems 230, 232 operating together. Accordingly, for example, the first processing system 230 can monitor and back up the second processing system 232 and the second processing system 232 can monitor and back up the first processing system 230.

In some embodiments, for example, the first processing system 230 may be a random access memory ("RAM") based processing system. Additionally or alternatively, the second processing system 232 may in some embodiments be a flash memory-based processing system. Additionally or alternatively, the memory blocks 234 may be RAM memory blocks.

As shown, in exemplary embodiments, the first and second processing systems 230, 232 may be mounted on the first face surface 210 of the main body 208. Alternatively, however, one or both of the first and second processing systems 230, 232 may be mounted on the second face surface 212 of the main body 208. Further, in some embodiments, at least one or more of the memory blocks 234 may be mounted on the first face surface 210. Additionally or alternatively, at least one or more of the memory blocks 234 may be mounted on the second face surface 212.

In some embodiments, a thermal interface material 236 may be disposed on one or more of the computing components. The thermal interface material 236 may facilitate heat transfer from such computing components to other components of the control box 100, as discussed herein. Suitable thermal interface materials 236 may, for example, be relatively compliant materials which may for example be curable. In exemplary embodiments, such materials 236 may be thixotropic materials. In exemplary embodiments, such materials 236 may have a thermal conductivity of between 3.2 and 4 W/m-K, such as between 3.4 and 3.8 W/m-K, such as 3.6 W/m-K. One suitable materials is Gap Filler 3500S35, which is commercially available from The Bergquist Company.

In exemplary embodiments, the thermal interface material 236 may be disposed on the memory blocks 234, such as one or more of the memory blocks 234 mounted on the first face surface 210 and/or one or more of the memory blocks 236 mounted on the second face surface 212. Additionally or alternatively, the thermal interface material 236 may be disposed on the first processing system 230 and/or the second processing system 232.

One or more input/output connectors 238 may additionally be mounted on the main body 208. These connectors 238 may connect the SOM circuit board 200 to other circuit boards, as discussed herein, in the control box 100, thus allowing communication between the SOM circuit board 200 and such other circuit boards. The connectors 238 may, for example, be mounted on the second face surface 212 as shown, or alternatively may be mounted on the first face surface 210. In some embodiments, the connectors 238 may be disposed proximate the first side surface 218, and thus closer to the first side surface 218 than the second side surface 220 along the lateral direction 202. In some of these embodiments, no connectors 238 may be provided proximate the second side surface 220. Further, longitudinal axes of the connectors 238 may be aligned along the longitudinal direction 204, as shown.

As further illustrated, a plurality of mounting holes 240 may extend through the main body 208. One or more of these mounting holes 240 may, for example, be utilized to connect the SOM circuit board 200 to other components in the control box 100. Each mounting hole 240 may extend along the transverse direction 206 through and between the first face surface 210 and the second face surface 212.

The locations of the mounting holes 240 in the main body may be particularly advantageous. For example, a first array 242 of the mounting holes 240 may be disposed proximate the first side surface 218, and in exemplary embodiments between the connectors 238 and the first side surface 218 along the lateral direction 202. The mounting holes 240 of the first array 242 may be spaced apart from each other along the longitudinal direction 204. In exemplary embodiments, the first array 242 may include three or more mounting holes, although in alternative embodiments two mounting holes may be utilized. A second array 244 of the mounting holes 240 may be disposed proximate the second side surface 220, and in exemplary embodiments may be spaced along the lateral direction 202 an equal distance from the second side surface 220 as the first array 244 is from the first side surface 218. The mounting holes 240 of the second array 244 may be spaced apart from each other along the longitudinal direction 204. In exemplary embodiments, the second array 244 may include three or more mounting holes, although in alternative embodiments two mounting holes may be utilized. The first and second arrays may advantageously both connect the SOM circuit board 200 to other components in the control box 100 and minimize any relative motion of the SOM circuit board 200 with respect to such components.

Additionally, one or more third mounting holes 246 may be disposed between the first array 242 and the second array 244 along the lateral direction 202. In exemplary embodiments, the one or more third mounting holes 246 may be positioned generally centrally between the first side surface 218 and the second side surface 220, such as along the lateral direction 202. The third mounting holes 246 may this be equally spaced from the first array 242 and the second array 244 along the lateral direction 202. Further, in embodiments wherein only a single third mounting hole 246 is utilized, the third mounting hole 246 may be positioned generally centrally between the first end surface 214 and the second end surface 216, such as along the longitudinal direction 204. The third mounting hole(s) 246 may be particularly advantageous, as such hole(s) 246 reduce resonant frequency issues during use of the SOM circuit board 200 and provide improved stiffness to the SOM circuit board 200.

In some embodiments, a plurality of vias 250 may be provided in SOM circuit board 200. Each via may extend through the body 208 along the transverse direction 206, and may protrude from the first face surface 210 and/or second face surface 212. Vias 250 may be located proximate the first side surface 218 and/or the second side surface 220. Vias 250 may in exemplary embodiments be formed from a metallic material, such as gold or copper, and may serve as heat transfer conduits to transfer heat from within the main body 208 and transfer this heat from the main body 208 and SOM circuit board 200 generally.

In some embodiments, one or more metallic coatings may be plated on the main body 208, such as on the first face surface 210 and/or second face surface 212 thereof. The metallic coatings may serve as heat transfer conduits to transfer heat from the main body 208 and SOM circuit board 200 generally.

For example, a first metallic coating 252 may be plated on portions of the body 208 (such as on the first face surface 210 and/or second face surface 212 thereof) defining the plurality of mounting holes 240 (including those mounting holes in the first and second arrays 242, 244 as well as the third mounting hole(s) 246. Such coating 252 may be discretely plated on such portions of the body 208, such that the various platings are not connected. In exemplary embodiments, such first metallic coating 252 is a copper coating, although in alternative embodiments gold or other suitable metals may be utilized.

Additionally or alternatively, a second metallic coating 254 may be plated the body 208 (such as on the first face surface 210 and/or second face surface 212 thereof). Such coating 252 may be located proximate the first and second side surfaces 218, 220, and may extend to such surfaces 218, 220, such as entirely along the length 224. In embodiments wherein both first and second metallic coatings 252, 254 are utilized, the second metallic coating 254 may be plated over the first metallic coating 252. In exemplary embodiments, such second metallic coating 254 is a gold coating, although in alternative embodiments copper or other suitable metals may be utilized.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system on module ("SOM") circuit board defining a lateral direction, a longitudinal direction, and a transverse direction, the SOM circuit board comprising:
a main body having a first face surface, an opposing second face surface, a first side surface, an opposing second side surface, a first end surface, and an opposing second end surface, the first and second side surfaces having maximum lengths along the longitudinal direction which are greater than maximum lengths of the first and second end surfaces along the lateral direction;

a plurality of computing components, each of the plurality of computing components mounted on one of the first face surface or the second face surface;

an input/output connector mounted on the second face surface, the input/output connector being connected to an additional circuit board, wherein the input/output connector defines a longitudinal axis and a lateral axis, wherein a maximum length of the input/output connector is measured on the longitudinal axis, and wherein the longitudinal axis of the input/output connector is aligned along the longitudinal direction of the SOM circuit board;

a plurality of mounting holes extending along the transverse direction through and between the first face surface and the second face surface, the plurality of mounting holes comprising a first array of mounting holes spaced apart along the longitudinal direction proximate the first side surface, a second array of mounting holes spaced apart along the longitudinal direction proximate the second side surface, and a third mounting hole disposed between the first array and second array along the lateral direction, wherein the third mounting hole is positioned centrally between the first side surface and the second side surface and centrally between the first end surface and second end surface;

a metallic coating plated on portions of the body defining the plurality of mounting holes;

a thermal interface material disposed on one or more of the computing components, a plurality of vias each of the plurality of vias extending through the body along the transverse direction and formed from a metallic material;

wherein the metallic coating is a first metallic coating, and further comprising a second metallic coating plated on the body.

2. The SOM circuit board of claim 1, wherein the first array and the second array each comprise at least three mounting holes.

3. The SOM circuit board of claim 1, wherein the metallic coating is a copper coating.

4. The ("SOM") circuit board of claim 1, wherein the second metallic coating is a gold coating.

5. The SOM circuit board of claim 1, wherein the plurality of computing components comprises a first processing system, a second processing system, and a plurality of memory blocks.

6. The SOM circuit board of claim 5, wherein the first processing system is a random access memory ("RAM") based processing system and the second processing system is a flash memory-based processing system.

7. The SOM circuit board of claim 1, wherein the input/output connector is disposed proximate the first side surface.

8. A system on module ("SOM") circuit board defining a lateral direction, a longitudinal direction, and a transverse direction, the SOM circuit board comprising:

a main body having a first face surface, an opposing second face surface, a first side surface, an opposing second side surface, a first end surface, and an opposing second end surface, the first and second side surfaces having maximum lengths along the longitudinal direction which are greater than maximum lengths of the first and second end surfaces along the lateral direction;

a plurality of computing components, each of the plurality of computing components mounted on one of the first face surface or the second face surface;

one or more input/output connectors mounted on the second face surface proximate the first side surface, the one or more input/output connectors being connected to an additional circuit board, wherein the one or more input/output connectors each define a longitudinal axis and a lateral axis, wherein a maximum length of at least one of the one or more input/output connectors is measured on the longitudinal axis, and wherein a longitudinal axis of one or more input/output connectors is aligned along the longitudinal direction of the SOM circuit board;

a plurality of mounting holes extending along the transverse direction through and between the first face surface and the second face surface, wherein the plurality of mounting holes comprises a first array of mounting holes spaced apart along the longitudinal direction proximate the first side surface, each mounting hole of the first array of the mounting holes being disposed between the one or more input/output connectors and the first side surface along the lateral direction;

a metallic coating plated on portions of the body defining the plurality of mounting holes;

a thermal interface material disposed on one or more of the computing components;

wherein the metallic coating is a first metallic coating, and further comprising a second metallic coating plated on the body; and a plurality of vias, each of the plurality of vias extending through the body along the transverse direction and formed from a metallic material.

9. The SOM circuit board of claim 8, wherein the plurality of mounting holes comprises a second array of mounting holes spaced apart along the longitudinal direction proximate the second side surface and a third mounting hole disposed between the first array and second array along the lateral direction.

10. The SOM circuit board of claim 9, wherein the third mounting hole is positioned generally centrally between the first side surface and second side surface and between the first end surface and second end surface.

11. The SOM circuit board of claim 9, wherein the first array and the second array of mounting holes each comprise at least three mounting holes.

12. A system on module ("SOM") circuit board defining a lateral direction, a longitudinal direction, and a transverse direction, the SOM circuit board comprising:

a main body having a first face surface, an opposing second face surface, a first side surface, an opposing second side surface, a first end surface, and an opposing second end surface, the first and second side surfaces having maximum lengths along the longitudinal direction which are greater than maximum lengths of the first and second end surfaces along the lateral direction;

a plurality of computing components, each of the plurality of computing components mounted on one of the first face surface or the second face surface;

one or more input/output connectors mounted on the second face surface proximate the first side surface, the one or more input/output connectors being connected to an additional circuit board, wherein the one or more input/output connectors each define a longitudinal axis and a lateral axis, wherein a maximum length of at least one of the one or more input/output connectors is measured on the longitudinal axis, and wherein a longitudinal axis of one or more input/output connectors is aligned along the longitudinal direction of the SOM circuit board;

a plurality of mounting holes extending along the transverse direction through and between the first face surface and the second face surface, wherein the plurality of mounting holes comprise a first array of mounting holes defined proximate the first side surface and a second array of mounting holes defined proximate the second side surface;

a first metallic coating plated on the body annularly around each mounting hole of the first array of mounting holes and each mounting hole of the second array of mounting holes;

a second metallic coating plated proximate the first side surface and the second side surface along an entirety of a length of the main body along the longitudinal direction and wherein the second metallic coating is plated over the first metallic coating, the second metallic coating being a different coating than the first metallic coating;

a thermal interface material disposed on one or more of the computing components; and a plurality of vias, each of the plurality of vias extending through the body along the transverse direction and formed from a metallic material.

13. The SOM circuit board of claim 12, wherein the second metallic coating is plated on at least one of the first face surface proximate the first face surface and the second face surface.

14. The SOM circuit board of claim 12, wherein the second metallic coating is a gold coating.

* * * * *